United States Patent
Tsutsumi (10) Patent No.: US 8,950,060 B2
(45) Date of Patent: Feb. 10, 2015

(54) DEVICE FOR MANUFACTURING ELECTRONIC COMPONENT

(75) Inventor: Hironori Tsutsumi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 453 days.

(21) Appl. No.: 13/309,584

(22) Filed: Dec. 2, 2011

(65) Prior Publication Data

US 2012/0073100 A1    Mar. 29, 2012

Related U.S. Application Data

(63) Continuation of application No. PCT/JP2010/059233, filed on Jun. 1, 2010.

(30) Foreign Application Priority Data

Jun. 5, 2009    (JP) .................. 2009-135713

(51) Int. Cl.
| | |
|---|---|
| B23P 19/00 | (2006.01) |
| H05K 13/04 | (2006.01) |
| H01G 4/30 | (2006.01) |
| H01G 4/008 | (2006.01) |
| H01G 4/232 | (2006.01) |
| H01G 13/00 | (2013.01) |
| H01F 17/00 | (2006.01) |
| H01G 4/12 | (2006.01) |

(52) U.S. Cl.
CPC .............. *H01G 4/30* (2013.01); *H01G 4/0085* (2013.01); *H01G 4/232* (2013.01); *H01G 13/006* (2013.01); *H01F 17/0013* (2013.01); *H01G 4/12* (2013.01)
USPC .................................. 29/729; 29/749; 29/755

(58) Field of Classification Search
CPC ..................... H01L 2224/32145; H01L 24/11; H01L 24/03; B01L 2300/0887; B23K 2201/40; B23K 2201/42
USPC ........ 29/729, 25.42, 749, 755, 825, 829, 846, 29/874; 385/24, 31, 42
See application file for complete search history.

(56) References Cited

U.S. PATENT DOCUMENTS

| | | | |
|---|---|---|---|
| 6,785,447 B2 * | 8/2004 | Yoshimura et al. | 385/42 |
| 7,242,433 B2 * | 7/2007 | Tanaka et al. | 348/340 |

FOREIGN PATENT DOCUMENTS

| | | | | |
|---|---|---|---|---|
| JP | 08-236391 A | | 9/1996 | |
| JP | 2000-021680 | * | 1/2000 | .............. H01G 4/30 |
| JP | 2000-021680 A | | 1/2000 | |
| JP | 2007-273728 A | | 10/2007 | |
| JP | 2007-294839 A | | 11/2007 | |
| JP | 2009-111256 A | | 5/2009 | |

OTHER PUBLICATIONS

Official Communication issued in International Patent Application No. PCT/JP2010/059233, mailed on Aug. 10, 2010.

* cited by examiner

*Primary Examiner* — Thiem Phan
(74) *Attorney, Agent, or Firm* — Keating & Bennett, LLP (57) ABSTRACT

A manufacturing method for an electronic component forms with a high degree of accuracy a portion of an outer electrode on a main surface of a dielectric block. Light irradiated from a second main surface side is detected by a detector disposed on a first main surface side, thereby detecting the positions of first and second inner electrodes, and a conductive layer is formed in a portion on a first main surface, determined based on the detection result by the detector, thereby forming first portions of individual first and second outer electrodes.

5 Claims, 11 Drawing Sheets

DEVICE FOR MANUFACTURING ELECTRONIC COMPONENT

BACKGROUND OF THE INVENTION

1. Field of the Invention

The present invention relates to a manufacturing method and a manufacturing device for an electronic component, and, in detail, relates to a manufacturing method and a manufacturing device for an electronic component in which a portion of an outer electrode is formed and located on a main surface.

2. Description of the Related Art

In recent years, for example, as an electronic component capable of being downsized, there has been widely used such a chip-type laminated ceramic electronic component as described in Japanese Unexamined Patent Application Publication No. 2007-294839. Usually, the chip-type laminated ceramic electronic component includes a dielectric block and a first outer electrode and a second outer electrode, provided on an end surface of the dielectric block. In view of the connectability between an electronic component and a substrate, usually, each of the first outer electrode and the second outer electrode is formed on the end surface and both the main surfaces of the dielectric block.

In addition, as a formation method for the first and second outer electrodes, for example, in Japanese Unexamined Patent Application Publication No. 8-236391 described below, a method is described in which, after being dipped in conductive paste, the end surfaces of a dielectric block is pulled out and dried, thereby forming the first and second outer electrodes.

In addition, in some cases, such a dielectric block is embedded in a multilayer substrate and used.

When being embedded in a multilayer substrate and used, an embedded electronic component is covered by a resin cover layer configuring a portion of the substrate, and via holes are formed in the resin cover layer. In addition to this, through the via holes, portions of the first and second outer electrodes, formed on the main surface of the dielectric block, are electrically connected to the multilayer substrate. Accordingly, since it is necessary to adjust the positions of the via holes and the positions of the portions of the first and second outer electrodes formed on the main surface of the dielectric block, with a high degree of accuracy, it is necessary to form the portions of the first and second outer electrodes formed on the main surface of the dielectric block with a high degree of accuracy.

However, as described in Japanese Unexamined Patent Application Publication No. 8-236391, in the method in which the outer electrodes are formed by dipping the end portions of the dielectric block in conductive paste, since the portions of the outer electrodes located on the main surface of the dielectric block are formed by wetting of the end portions with conductive paste, it has been difficult to form the outer electrodes with a high degree of accuracy.

SUMMARY OF THE INVENTION

Preferred embodiments of the present invention provide a manufacturing method for an electronic component in which a portion of an outer electrode is located on the main surface of a dielectric block, the manufacturing method being capable of forming, with a high degree of accuracy, the portion of the outer electrode located on the main surface of the dielectric block.

A manufacturing method for an electronic component according to a preferred embodiment of the present invention is a manufacturing method for an electronic component including a rectangular parallelepiped-shaped dielectric block that includes first and second main surfaces extending in a height direction, first and second side surfaces extending in a width direction, and first and second end surfaces, a first inner electrode extending from the first end surface to the inside of the dielectric block, a second inner electrode extending from the second end surface to the inside of the dielectric block and facing the first inner electrode, a first outer electrode connected to the first inner electrode, and a second outer electrode connected to the second inner electrode, wherein the first outer electrode includes a first portion located on the first main surface, a second portion located on the second main surface, and a third portion located on the first end surface, and the second outer electrode includes a first portion located on the first main surface, a second portion located on the second main surface, and a third portion located on the second end surface, and the manufacturing method includes a preparation process in which a dielectric block including the first and second inner electrodes is prepared, and a formation process in which the first and second outer electrodes are formed on the dielectric block. In the manufacturing method for an electronic component according to the present preferred embodiment of the present invention, in the formation process, light irradiated from the second main surface side to the dielectric block is detected by a detector disposed on the first main surface side, thereby detecting the positions of the first and second inner electrodes within the dielectric block, and a conductive layer is formed in a portion on the first main surface, determined based on the detection result of the detector, thereby forming the first portion of each of the first and second outer electrodes.

In a preferred embodiment of the present invention, in the formation process, light irradiated from the first main surface side to the dielectric block is detected by a second detector disposed on the second main surface side, thereby detecting the positions of the first and second inner electrodes within the dielectric block, and a conductive layer is formed in a portion on the second main surface, determined based on the detection result of the second detector, thereby forming the second portion of each of the first and second outer electrodes. According to this configuration, it is also possible to form the second portion of each of the first and second outer electrodes with a high degree of accuracy.

In another preferred embodiment of the present invention, the dielectric block prepared in the preparation process preferably is a mother substrate in which a plurality of pairs of the first and second inner electrodes are formed in a matrix pattern, and the formation process includes a cutting process in which, after the conductive layer has been formed, the mother substrate is cut into a plurality of chips and the first portion of each of the first and second outer electrodes is formed from the conductive layer, and a process in which the third portion of each of the first and second outer electrodes is formed with respect to each of the plurality of chips. According to this configuration, it is possible to manufacture a plurality of electronic components simultaneously in parallel. Accordingly, it is possible to manufacture the plurality of electronic components in a short period of time with fewer processes.

In another preferred embodiment of the present invention, the first portion of each of the first and second outer electrodes is formed throughout an entire region in the width direction of the dielectric block, and the conductive layer is formed in a stripe configuration along the width direction of the dielectric block. In this configuration, when the first and second conductive layers are formed, it is not necessary to consider a formation position in the width direction with respect to the inner electrode. Accordingly, it is easy to perform the positioning of the formation position.

Furthermore, in another preferred embodiment of the present invention, the conductive layer is formed through the use of a screen printing method, an ink-jet printing method, a gravure printing method, or a photolithography method, for example. When the ink-jet printing method is used for the formation of the conductive layer, no mask is necessary and it is possible to form the conductive layer with a high degree of accuracy. In addition, even if there are a concavity and a convexity on a formation surface, it is possible to apply the ink-jet printing method. When the gravure printing method is used for the formation of the conductive layer, it is possible to form the conductive layer at high speed. When the photolithography method is used for the formation of the conductive layer, it is possible to form the conductive layer with a high degree of accuracy.

A manufacturing device for an electronic component according to another preferred embodiment of the present invention relates to a manufacturing device for manufacturing an electronic component preferably according to the abovementioned manufacturing method for an electronic component according to a preferred embodiment of the present invention. The manufacturing device for an electronic component according to a preferred embodiment of the present invention includes a light source causing the dielectric block to be subjected to light, the detector, and a formation mechanism that forms the conductive layer.

In various preferred embodiments of the present invention, since the conductive layer is formed at a position determined based on the optically detected position of an inner electrode, it is possible to form the first portion of each of the first and second outer electrodes with a high degree of accuracy. Accordingly, it is possible to manufacture an electronic component in which the first portion of each of the first and second outer electrodes is accurately formed at the exact correct position.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to drawings, and hence the present invention will be clarified.

Figure 1:
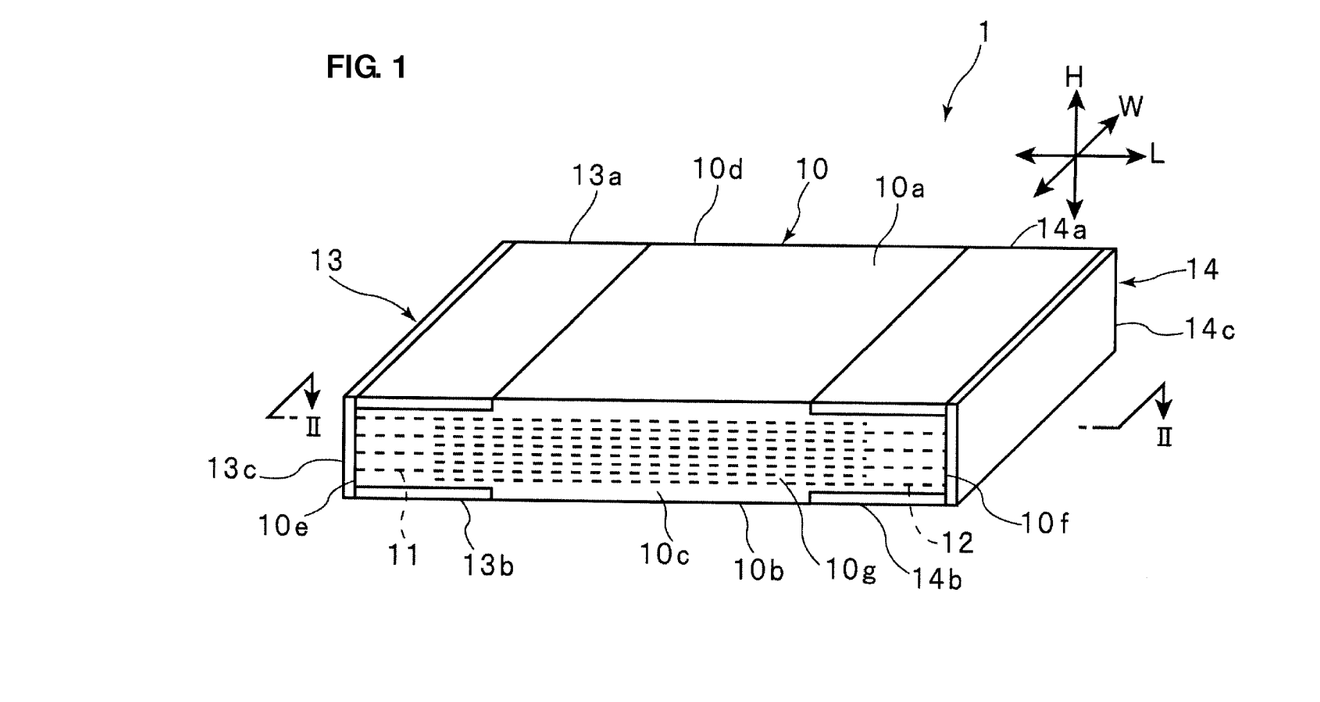
FIG. 1 is a schematic perspective view of an electronic component manufactured according to a preferred embodiment of the present invention.
Figure 2:
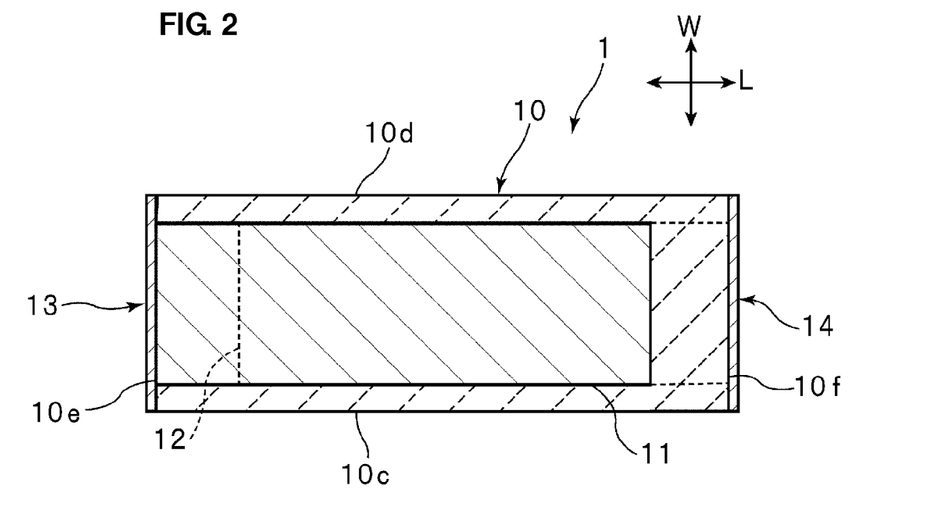
FIG. 2 is a cross-sectional view along line II-II in FIG. 1.

FIG. 1 is a schematic perspective view of an electronic component manufactured according to the present preferred embodiment of the present invention, and FIG. 2 is a schematic cross-sectional view when being cut along the length direction of the electronic component. First, with reference to FIG. 1 and FIG. 2, an electronic component will be described in detail that is manufactured by a manufacturing device for an electronic component according to the present preferred embodiment.

An electronic component 1 illustrated in FIG. 1 is a ceramic electronic component including a ceramic dielectric block 10 having optical transparency. For example, the electronic component 1 may be a ceramic capacitor, a ceramic piezoelectric element, a ceramic thermistor, a ceramic inductor, or other suitable electronic component, for example.

The ceramic material configuring the ceramic dielectric block 10 is not specifically limited, and may be selected in accordance with an electrical characteristic to be obtained.

For example, when the electronic component 1 is a ceramic capacitor, the dielectric block 10 may be formed using material whose main component is dielectric ceramic. For example, as a specific example of the dielectric ceramic, $BaTiO_3$, $CaTiO_3$, $SrTiO_3$, $CaZrO_3$, or other suitable material may be used.

In addition, for example, when the electronic component 1 is a ceramic piezoelectric element, the ceramic dielectric block 10 may be formed using a material whose main component is piezoelectric ceramic, for example. As a specific example of the piezoelectric ceramic, PZT (lead zirconate titanate) ceramic or other suitable material may be used, for example.

For example, when the electronic component 1 is a thermistor element, the ceramic dielectric block 10 may be formed using semiconductor ceramic, for example. As a specific example of the semiconductor ceramic, spinel ceramic or the like may be used, for example.

For example, when the electronic component 1 is an inductor element, the ceramic dielectric block 10 may be formed using magnetic ceramic. As a specific example of the magnetic ceramic, ferrite ceramic or the like may be cited, for example.

As illustrated in FIG. 1, the ceramic dielectric block 10 is preferably formed to have the shape of a rectangular parallelepiped, for example. The ceramic dielectric block 10 includes first and second main surfaces 10a and 10b, extending in a height direction H, first and second side surfaces 10c and 10d, extending in a width direction W, and first and second end surfaces 10e and 10f, extending in a length direction L.

As illustrated in FIG. 1 and FIG. 2, a plurality of first inner electrodes 11 and a plurality of second inner electrodes 12 are provided within the ceramic dielectric block 10. Each of the plurality of first inner electrodes 11 extends from the first end surface 10e to a second end surface 10f side along the length direction L within the ceramic dielectric block 10. Each of the plurality of second inner electrodes 12 extends from the second end surface 10f to a first end surface 10e side along the length direction L within the ceramic dielectric block 10. In the height direction H, the plurality of first inner electrodes 11 and the plurality of second inner electrodes 12 are alternately disposed at intervals. More specifically, the first inner electrode 11 and the second inner electrode 12 adjacent to each other face each other across a dielectric layer 10g.

The first and second inner electrodes 11 and 12 have light blocking effects. Specifically, the first and second inner electrodes 11 and 12 are formed using metal or alloy such as Ag, Au, Pt, or the like having a light blocking effect. Although not specifically limited, the thicknesses of the first and second inner electrodes 11 and 12 may be set to about 0.5 µm to about 5.0 µm, for example.

In addition, the light blocking effects of the first and second inner electrodes 11 and 12 and the optical transparency of the dielectric block 10 are relative definitions. More specifically, that the first and second inner electrodes 11 and 12 have the light blocking effects and the dielectric block 10 has the optical transparency refers to the fact that the optical transmittances of the first and second inner electrodes 11 and 12 are lower than that of the dielectric block 10 and when light is irradiated from one side of the dielectric block 10, the first and second inner electrodes 11 and 12 are visible as dark portions from the other side of the dielectric block 10. Accordingly, the optical transmittances of the first and second inner electrodes 11 and 12 may not be 0%, and the optical transmittance of the dielectric block 10 may not be 100%.

In addition, the dielectric block 10 may be formed using a ceramic material that substantially transmits no light. Even in that case, light goes through gaps between dielectric particles.

A first outer electrode 13 is connected to the first inner electrode 11. The first outer electrode 13 includes a first portion 13a located on the first end surface 10e-side portion of the first main surface 10a, a second portion 13b located on the first end surface 10e-side portion of the second main surface 10b, and a third portion 13c formed on the first end surface 10e and connected to the first and second portions 13a and 13b. The first and second portions 13a and 13b are formed throughout entire regions in the width direction W of the dielectric block 10.

On the other hand, a second outer electrode 14 is connected to the second inner electrode 12. The second outer electrode 14 includes a first portion 14a formed on the second end surface 10f-side portion of the first main surface 10a, a second portion 14b located on the second end surface 10f-side portion of the second main surface 10b, and a third portion 14c located on the second end surface 10f and connected to the first and second portions 14a and 14b. The first and second portions 14a and 14b are arranged throughout entire regions in the width direction W of the dielectric block 10.

The first outer electrode 13 and the second outer electrode 14 may have light blocking effects and may have optical transparency. The formation material of the first outer electrode 13 and the second outer electrode 14 is not specifically limited. The first outer electrode 13 and the second outer electrode 14 may be formed using metal or alloy such as Ag, Au, Pt, or other suitable material, for example.

Although not specifically limited, the thicknesses of the first and second outer electrodes 13 and 14 may be set to about 5 µm to about 20 µm, for example. The thicknesses of the first and second portions 13a and 13b and the first and second portions 14a and 14b may be the same as those of the third portion 13c and 14c and may be different from those of the third portion 13c and 14c, for example.

Next, a manufacturing device 20 and a manufacturing method for an electronic component according to the present preferred embodiment will be described in detail with reference to mainly FIG. 3 to FIG. 10.

Figure 3:
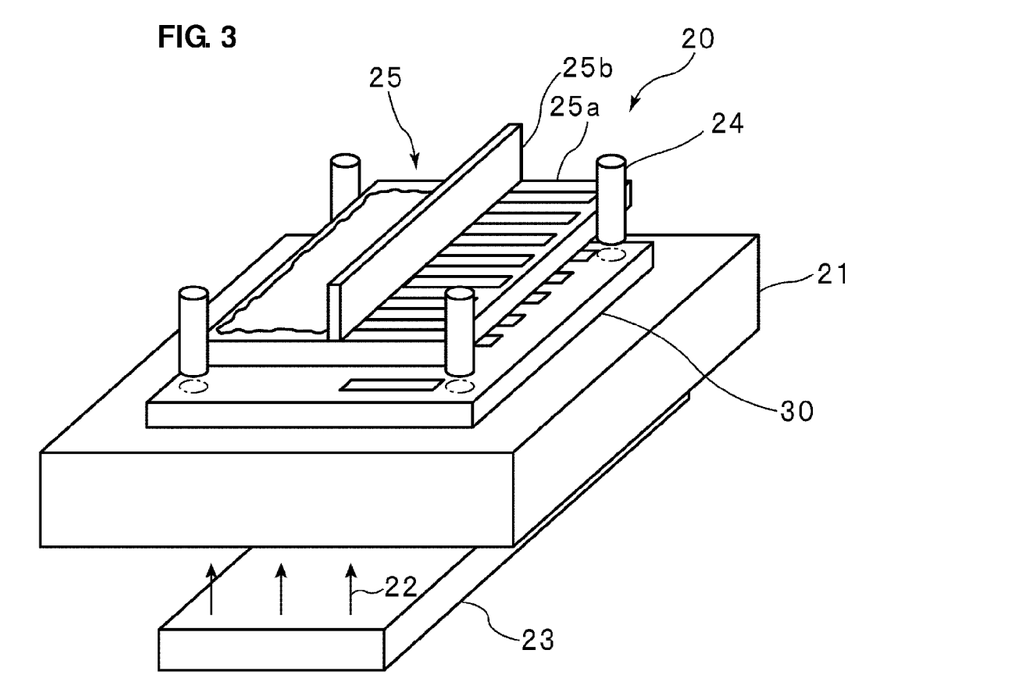
FIG. 3 is a schematic perspective view of a manufacturing device for an electronic component according to a preferred embodiment of the present invention.

As illustrated in FIG. 3, the manufacturing device 20 includes an optically transparent table 21. The optically transparent table 21 may be configured using a glass substrate, a plastic substrate, a ceramic substrate, or other suitable substrate, for example.

On the back surface side of the optically transparent table 21, a light source 23 is disposed that outputs light 22 to an optically transparent table 21 side. The type of the light source 23 is not specifically limited. For example, the light source 23 may include a light-emitting element such as a fluorescent light, an LED (Light Emitting Diode) element, or other suitable light source. The wavelength of the light output from the light source 23 is also not specifically limited, and a wavelength may be adopted that is detectable by a camera 24 described later.

Above the optically transparent table 21, the camera 24 that defines a detector is disposed. In the present preferred embodiment, a plurality of the cameras 24, for example, are provided. More specifically, in the present preferred embodiment, four cameras 24 are preferably disposed at the four corners of the optically transparent table 21, for example. The cameras 24 are disposed to face the light source 23 across the optically transparent table 21, so as to be able to detect the light output from the light source 23. In addition, in the present invention, the detector is not limited to the camera, and the detector may be a light receiving element, for example. In addition, only one detector or any number of detectors may be used.

In addition, above the optically transparent table 21, as a formation mechanism that forms a conductive layer, in the present preferred embodiment, a screen printing mechanism 25 to perform screen printing is disposed. The screen printing mechanism 25 includes a screen plate 25a and a squeegee 25b.

Next, a manufacturing method for the electronic component 1 in the present preferred embodiment will be described in detail with reference to mainly FIG. 10.

Figure 4:
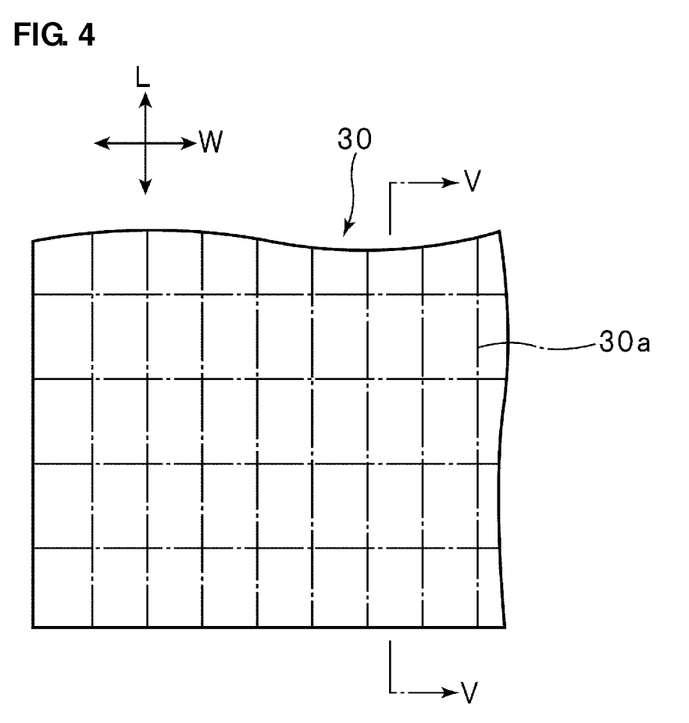
FIG. 4 is a plan view of a mother substrate.
Figure 5:
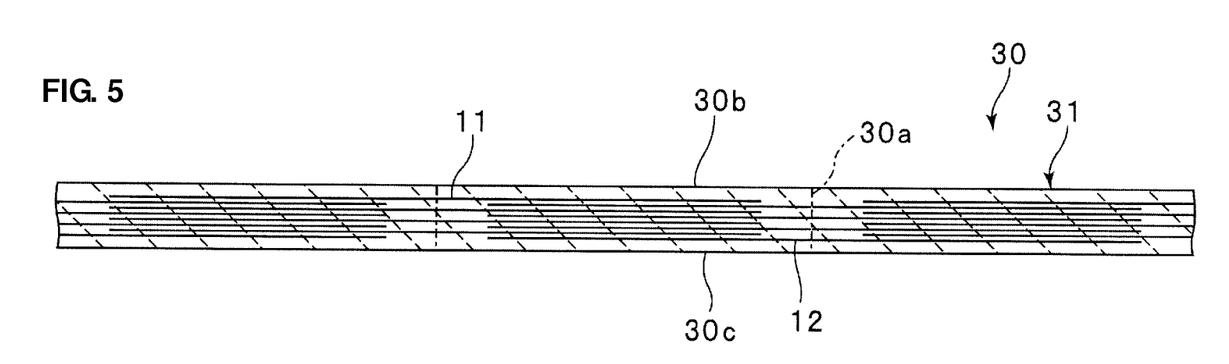
FIG. 5 is a cross-sectional view along line V-V in FIG. 4.

First, in Step S1, a non-fired mother substrate 30 illustrated in FIG. 4 and FIG. 5 is prepared. In addition, using suction or the like, the prepared mother substrate 30 is fixed on the optically transparent table 21 so that the second main surface 30c of the mother substrate 30 is located on an optically transparent table 21 side.

The mother substrate 30 is used to manufacture the plurality of electronic components 1. More specifically, as illustrated in FIG. 5, the mother substrate 30 includes a dielectric block 31 and a plurality of pairs of the first and second inner electrodes 11 and 12 arranged in a matrix pattern within the dielectric block 31. In a process described later, after the first and second portions 13a and 13b and the first and second portions 14a and 14b of the first and second outer electrodes 13 and 14 have been formed, the mother substrate 30 is divided along a cutting-plane line 30a, thereby forming a plurality of chips to define configuration elements of the electronic component 1.

In addition, in the present preferred embodiment, the position of the cutting-plane line 30a is determined using a cut mark as a mark, the cut mark being formed in a process in which the inner electrode 11 or 12 is formed on the dielectric layer 10g, and in detail, the position of the cutting-plane line 30a is determined using a cut mark as a mark, the cut mark being exposed by partially cutting the end portion of the mother substrate. In addition, one of a pair of the first portions 13a and 14a and a pair of the second portions 13b and 14b, formed on the main surface, may be formed by disposing, in a lowermost layer or an uppermost layer, the dielectric layer 10g in which a conductive layer has been preliminarily formed.

Figure 10:
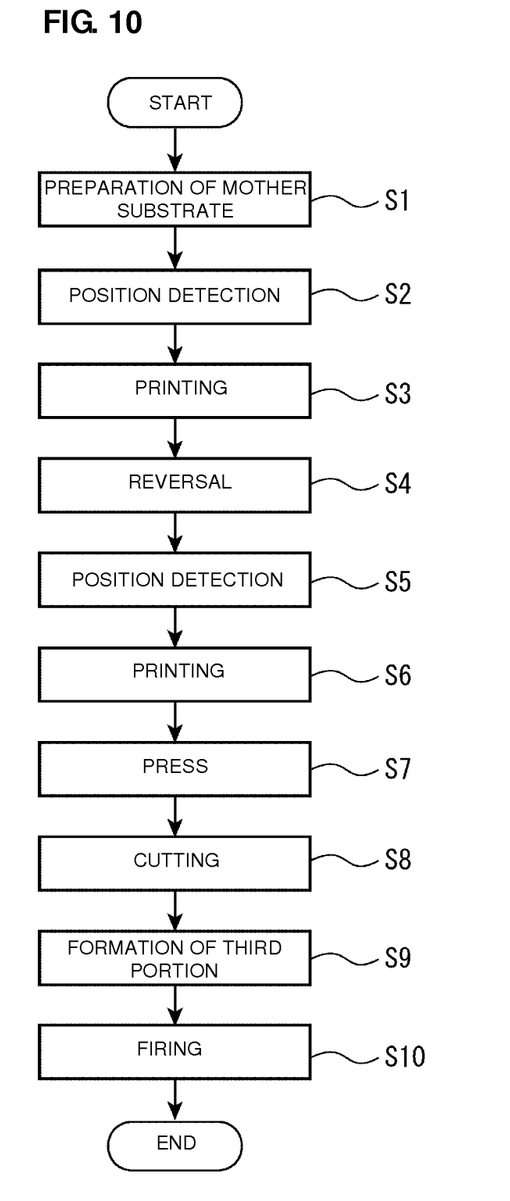
FIG. 10 is a flowchart illustrating a manufacturing method for an electronic component.

Next, as illustrated in FIG. 10, in Step S2, the positions of the first and second inner electrodes 11 are 12 are detected (a first position detection process). Specifically, the light source 23 illustrated in FIG. 3 is turned on, and the second main surface 30c of the mother substrate 30 is subjected to the light from the light source 23. Here, it is desirable that the light irradiated from the light source 23 has enough light intensity for the first and second inner electrodes 11 and 12 to be seen through, and it is desirable that the light has the light intensity greater than or equal to 10000 lux, for example. In addition, using the camera 24 disposed on the first main surface 30b side of the mother substrate 30, the light going through the mother substrate 30 is detected. Accordingly, the positions of the first and second inner electrodes 11 and 12 are detected.

In addition, in the present preferred embodiment, an example will be described in which the positions of the first and second inner electrodes 11 and 12 located at the four corners of the mother substrate 30 are only detected. In this regard, however, the present invention is not limited to this example. For example, the positions of the first and second inner electrodes 11 and 12 may also be detected only at one point, and all the positions of the first and second inner electrodes 11 and 12 may also be detected. However, it is desirable that the positions of the first and second inner electrodes 11 and 12 are detected at more than one point in such a way as in the present preferred embodiment. By doing so, it is also possible to correctly detect the rotation angle of the mother substrate 30 in in-plane direction on the optically transparent table 21.

Next, in Step S3, the printing of a first conductive layer 33 is performed (a first formation process). This first conductive layer 33 is a portion to be the first portions 13a and 14a of the first and second outer electrodes 13 and 14. Specifically, based on the positions of the first and second inner electrodes 11 and 12 detected in Step S2 that is the first position detection process, a portion is determined in which the first conductive layer 33 is to be formed, from the first main surface 30b of the mother substrate 30. In addition, in the determined portion, using the screen printing mechanism 25, the first conductive layer 33 is formed preferably using a screen printing method, for example.

Figure 6:
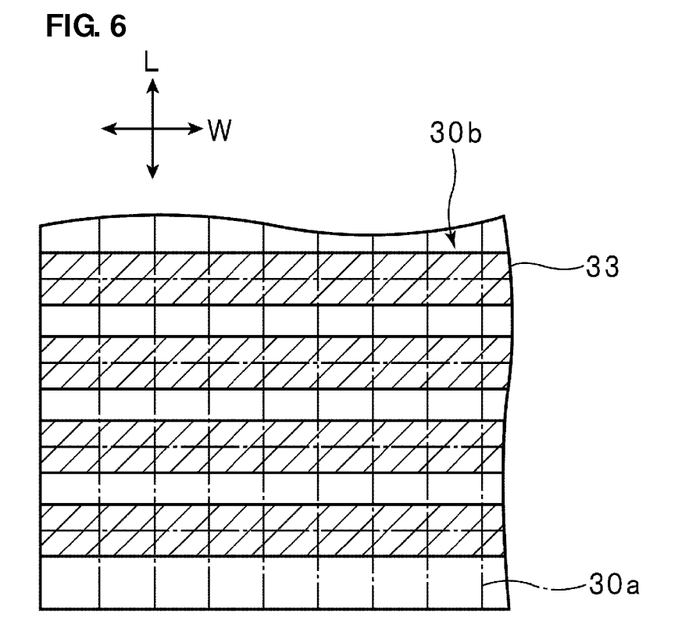
FIG. 6 is a plan view of a mother substrate in which a first conductive layer is formed.

Here, in the present preferred embodiment, the first portions 13a and 14a of the first and second outer electrodes 13 and 14 are formed throughout entire regions in the width direction W of the dielectric block 10. Therefore, as illustrated in FIG. 6, the plurality of first conductive layers 33 may be formed in stripes along the width direction W of the mother substrate 30. Accordingly, it is only necessary to perform, in the length direction L, the positioning of a portion in which the first conductive layer 33 is formed, and it is not always necessary to perform the positioning in the width direction W. Accordingly, less time is required for positioning, and it is easy to manufacture the electronic component 1.

Next, as illustrated in FIG. 10, in Step S4, the mother substrate 30 in which the first conductive layer 33 is formed is detached from the optically transparent table 21, and after being reversed, is fixed to the optically transparent table 21 again. Accordingly, a state occurs in which the second main surface 30c of the mother substrate 30 is exposed and the first main surface 30b side thereof is fixed to the optically transparent table 21.

Next, in Step S5, the position detection of the first and second inner electrodes 11 and 12 is performed (a second position detection process). This process is performed in substantially the same procedure as in the above-mentioned Step S2. More specifically, the light source 23 illustrated in FIG. 3 is turned on, and the first main surface 30b of the mother substrate 30 is subjected to the light from the light source 23. In addition, using the camera 24 disposed on the second main surface 30c side of the mother substrate 30, the light going through the mother substrate 30 is detected. Accordingly, the positions of the first and second inner electrodes 11 and 12 are detected.

Figure 7:
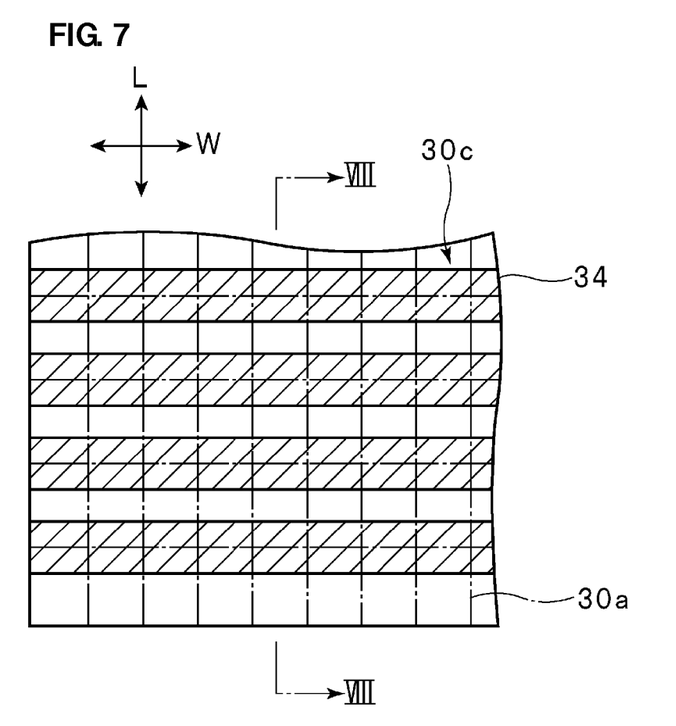
FIG. 7 is a plan view of a mother substrate in which a second conductive layer is formed.

Next, in Step S6 illustrated in FIG. 10, the printing of a second conductive layer 34 illustrated in FIG. 7 is performed using substantially the same procedure as in the above-mentioned Step S3 (a second formation process). This second conductive layer 34 is a portion to be the second portions 13b and 14b of the first and second outer electrodes 13 and 14. Specifically, based on the positions of the first and second inner electrodes 11 and 12, detected in Step S5 that is the second position detection process, a portion is determined in which the second conductive layer 34 is to be formed, from the second main surface 30c of the mother substrate 30. In addition, in the determined portion, using the screen printing mechanism 25, the second conductive layer 34 is formed preferably using a screen printing method.

Here, in the present preferred embodiment, the second portions 13b and 14b of the first and second outer electrodes 13 and 14 are formed throughout entire regions in the width direction W of the dielectric block 10. Therefore, as illustrated in FIG. 7, the plurality of second conductive layers 34 may be formed in stripes along the width direction W of the mother substrate 30. Accordingly, it is only necessary to perform, in the length direction L, the positioning of a portion in which the second conductive layer 34 is formed, and it is not always necessary to perform the positioning in the width direction W. Accordingly, less time taken for the positioning is necessary, and it is easy to manufacture the electronic component 1.

Figure 8:
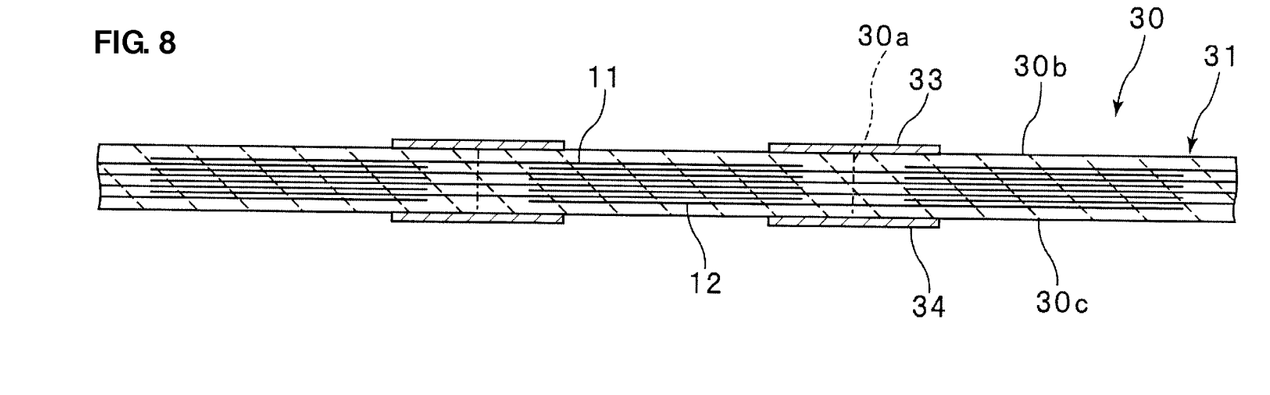
FIG. 8 is a cross-sectional view along line VIII-VIII in FIG. 7.

FIG. 8 illustrates the schematic cross-sectional view of the mother substrate 30 in which the first and second conductive layers 33 and 34 are formed. As illustrated in FIG. 8, when Step S6 has been completed, the first and second conductive layers 33 and 34 protrude from the first and second main surfaces 30b and 30c. Therefore, next, in Step S7 illustrated in FIG. 10, the mother substrate 30 is pressed in the height direction H (a pressing process). Accordingly, the first and second conductive layers 33 and 34 are caused to be buried in the mother substrate 30, and the first and second portions 13a and 13b and the first and second portions 14a and 14b of the first and second outer electrodes 13 and 14 are formed.

Figure 9:
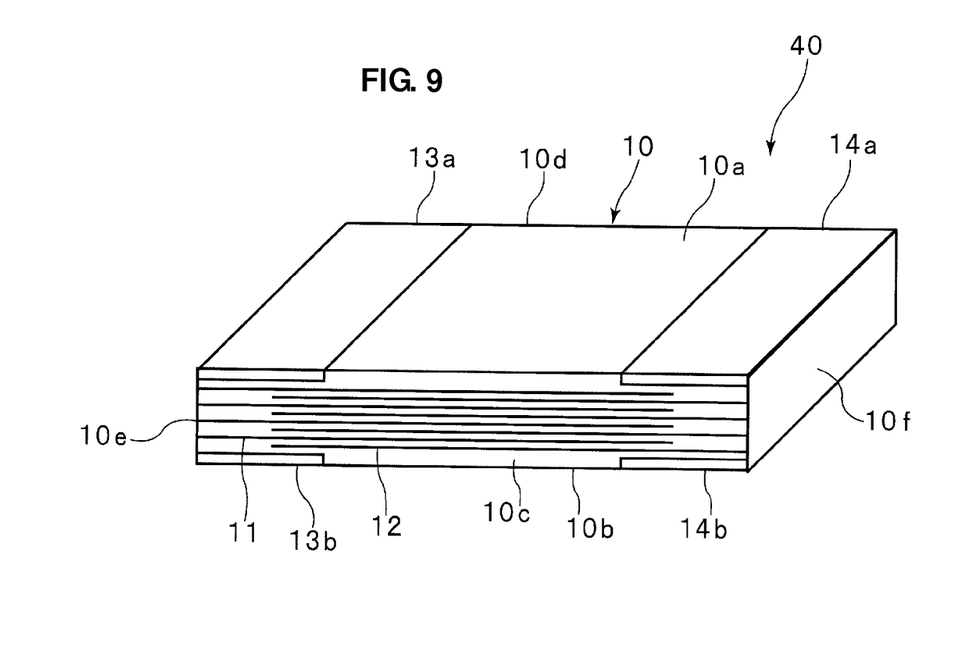
FIG. 9 is a schematic perspective view of a chip.

Next, as illustrated in FIG. 10, in Step S8, the mother substrate 30 is cut off along the cutting-plane line 30a illustrated in FIG. 8, thereby forming a plurality of chips 40 illustrated in FIG. 9 (a cutting process).

Subsequently, in Step S9, the third portions 13c and 14c of the first and second outer electrodes 13 and 14 are formed in the chip 40 (a third portion formation process). The formation method of the third portions 13c and 14c is not specifically limited, and any known formation process may be adopted. For example, the third portions 13c and 14c may be formed by applying conductive paste to the first and second end surfaces 10e and 10f.

Finally, in Step S10 illustrated in FIG. 10, by firing the chip 40 in which the third portions 13c and 14c are formed, the electronic component 1 illustrated in FIG. 1 is completed.

As described above, in the present preferred embodiment, the positions of the first and second inner electrodes 11 and 12 are optically detected, and based on the detection result of the optical detection, the first portions 13a and 14a of the individual first and second outer electrodes 13 and 14 are formed. Therefore, the first portions 13a and 14a of the individual first and second outer electrodes 13 and 14 can be formed at correct positions. In addition, compared with a dipping method, when an outer electrode is formed using a printing method, it is possible to reduce the thickness of the outer electrode, and it is possible to produce a smaller electronic component.

Figure 11:
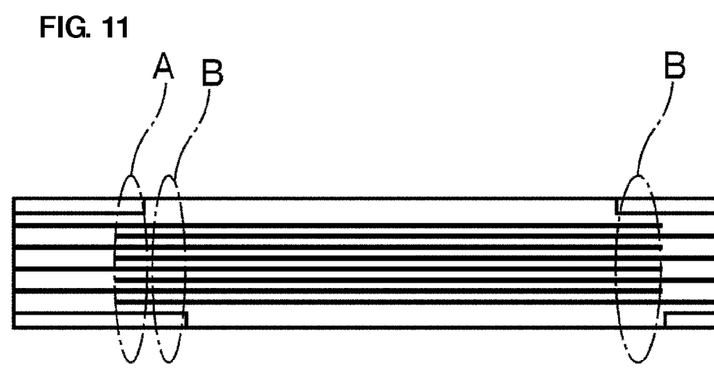
FIG. 11 is a side view of an electronic component when the formation positions of first and second conductive layers are misaligned.

In addition, for example, when, unlike in the present preferred embodiment, the position detection operations in Step S2 and Step S5 are not performed, the formation positions of the first and second conductive layers are misaligned in some cases. If the mother substrate is pressed in this state, a portion on which great pressure is applied and a portion on which pressure is not fully applied occur. For example, in a case illustrated in FIG. 11, a portion A in which conductive layers overlap with one another in the height direction (namely, a pressing direction) and a portion B in which conductive layers do not overlap with one another in the height direction occur. In this case, pressure is concentrated in the portion A. Accordingly, excessive pressure is applied on the portion A. On the other hand, insufficient pressure is only applied on the portion B. Accordingly, structural defects occur in both the portion A and the portion B in some cases. As a result, the non-defective product rate of the electronic component is lowered in some cases.

On the other hand, in the present preferred embodiment, as described above, the first and second conductive layers 33 and 34 are formed at correct positions with respect to the first and second inner electrodes 11 and 12. Therefore, it is possible to effectively prevent a portion in which conductive layers overlap with one another in the height direction H and a portion in which conductive layers do not overlap with one another in the height direction from occurring. Consequently, it is possible to prevent a portion on which excessive pressure is applied and a portion on which insufficient pressure is only applied from occurring. Accordingly, it is possible to prevent structural defects from occurring. As a result, it is possible to manufacture electronic components with a high non-defective product rate.

Hereinafter, an example of a modification to the above-described preferred embodiment will be described. In the following description, a member having a function that is substantially the same as the above-mentioned preferred embodiment will be referred to using a common symbol and the description thereof will be omitted.

In the above-described preferred embodiment, a case has been described in which the screen printing mechanism 25 is provided in the manufacturing device 20 and the first and second conductive layers 33 and 34 are formed preferably using the screen printing method. In this regard, however, the formation method of the first and second conductive layers 33 and 34 is not limited to the screen printing method.

Figure 12:
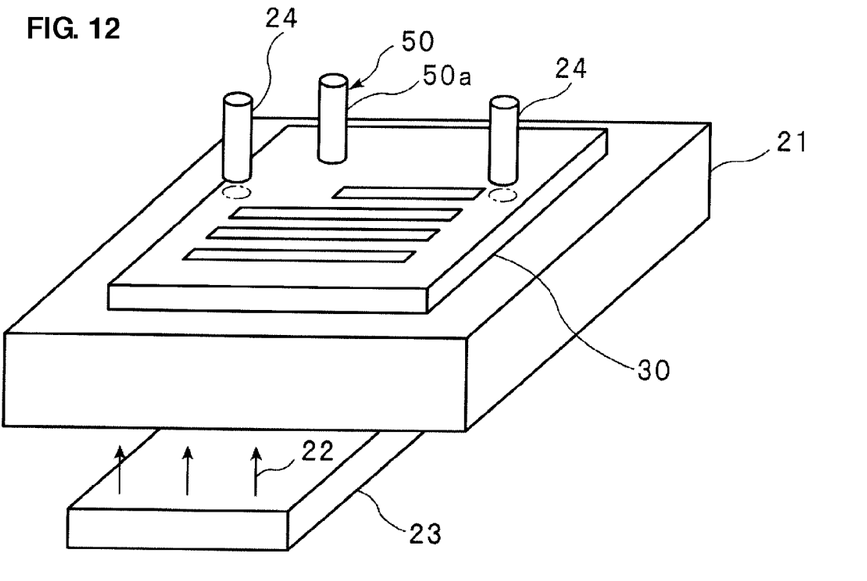
FIG. 12 is a schematic perspective view of a manufacturing device for an electronic component according to a first example of a modification of a preferred embodiment of the present invention.

For example, the first and second conductive layers 33 and 34 may be formed preferably using an ink-jet printing method, for example. In the ink-jet printing method, no mask is necessary and it is possible to print conductive layers with a high degree of accuracy. In addition, even if there are a concavity and a convexity on the surface of the mother substrate 30, it is possible to print conductive layers with a high degree of accuracy. When the ink-jet printing method is used, an ink-jet printing mechanism 50 including an ink-jet nozzle 50a may be provided in the manufacturing device 20, as illustrated in FIG. 12.

Figure 13:
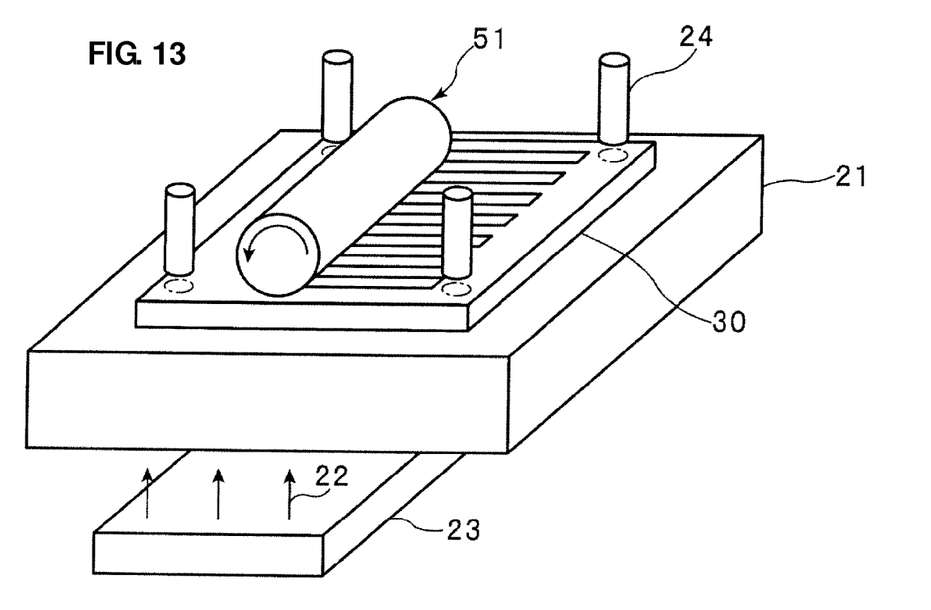
FIG. 13 is a schematic perspective view of a manufacturing device for an electronic component according to a second example of a modification of a preferred embodiment of the present invention.
Figure 14:
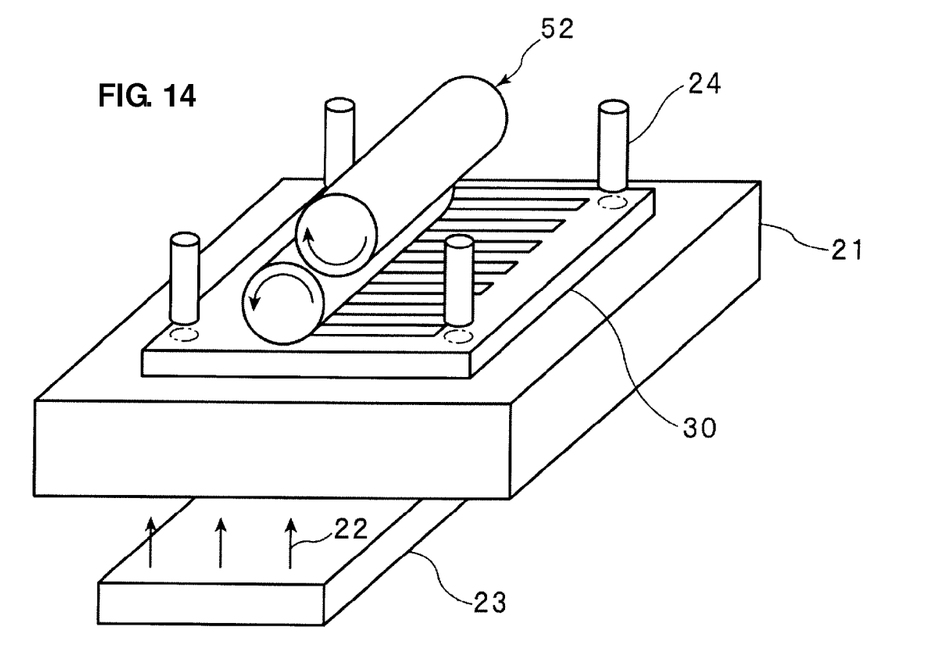
FIG. 14 is a schematic perspective view of a manufacturing device for an electronic component according to a third example of a modification of a preferred embodiment of the present invention.

In addition, the first and second conductive layers 33 and 34 may be formed using a gravure printing method, a relief printing method, an intaglio printing method, or other suitable method. In this case, it is possible to print on the large mother substrate 30 with a high degree of accuracy. When the relief printing method or the intaglio printing method is used, a printing mechanism 51 or 52 used for the relief printing method or the intaglio printing method may be provided in the manufacturing device 20, as illustrated in FIG. 13 or FIG. 14. The printing mechanism 51 is a mechanism that performs printing based on a direct method in which printing is directly performed using an intaglio printing plate or relief printing plate roll. The printing mechanism 52 is a mechanism that performs printing based on a so-called fitting method in which printing is indirectly performed through a blanket.

Figure 15:
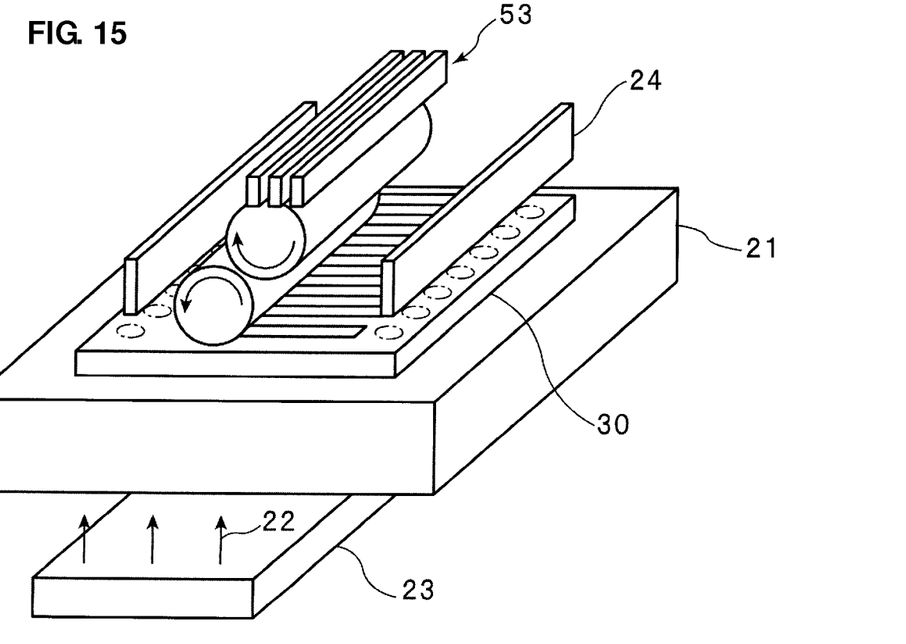
FIG. 15 is a schematic perspective view of a manufacturing device for an electronic component according to a fourth example of a modification of a preferred embodiment of the present invention.

In addition, the first and second conductive layers 33 and 34 may also be formed preferably using an electrophotographic method, for example. In that case, as illustrated in FIG. 15, it is desirable that an electrophotographic printing mechanism 53 to perform implementation of the electrophotographic method is provided in the manufacturing device 20.

Figure 16:
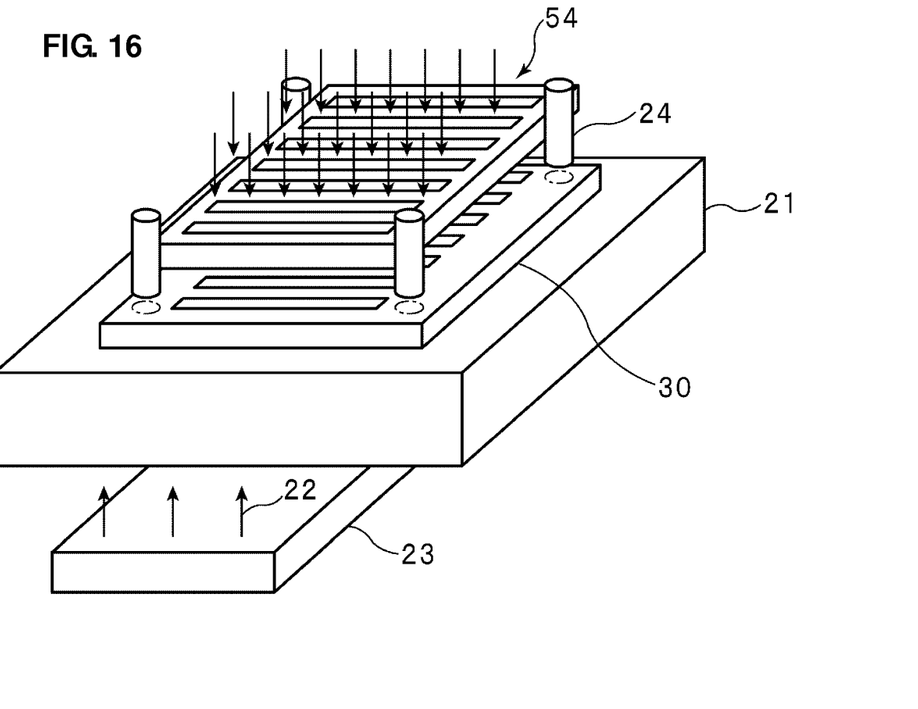
FIG. 16 is a schematic perspective view of a manufacturing device for an electronic component according to a fifth example of a modification of a preferred embodiment of the present invention.

In addition, the first and second conductive layers 33 and 34 may also be formed preferably using a photolithography method, for example. In that case, as illustrated in FIG. 16, it is desirable that a photolithography mechanism 54 to implement the photolithography method is provided in the manufacturing device 20.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A manufacturing device for manufacturing an electronic component including a rectangular parallelepiped-shaped dielectric block that includes first and second main surfaces extending in a height direction, first and second side surfaces extending in a width direction, and first and second end surfaces, a first inner electrode extending from the first end surface to an inside of the dielectric block, a second inner electrode extending from the second end surface to the inside of the dielectric block and facing the first inner electrode, a first outer electrode connected to the first inner electrode, and a second outer electrode connected to the second inner electrode, wherein the first outer electrode includes a first portion located on the first main surface, a second portion located on the second main surface, and a third portion located on the first end surface, and the second outer electrode includes a first portion located on the first main surface, a second portion located on the second main surface, and a third portion located on the second end surface, the manufacturing device comprising:

a light source arranged to subject the dielectric block to light;

a detector disposed on a side of the first main surface of the dielectric block and arranged to detect light from the light source that is irradiated from a side of the second main surface of the dielectric block in order to detect positions of the first and second inner electrodes within the dielectric block; and a formation mechanism configured to form a conductive layer on a portion of the first main surface at a position determined based on a detection result of the detector in order to form the first portion of each of the first and second outer electrodes.

2. The manufacturing device according to claim 1, further comprising:

a second detector disposed on the side of the second main surface of the dielectric block and arranged to detect light from the light source that is irradiated from the side of the first main surface of the dielectric block in order to detect positions of the first and second inner electrodes within the dielectric block; wherein the formation mechanism is configured to form a second conductive layer on a portion of the second main surface at a position determined based on a detection result of the second detector in order to form the second portion of each of the first and second outer electrodes.

3. The manufacturing device according to claim 1, wherein the dielectric block is a mother substrate in which a plurality of pairs of the first and second inner electrodes are arranged in a matrix pattern;

the formation mechanism includes a cutter arranged to cut the mother substrate into a plurality of chips after the conductive layer has been formed, such that the first portion of each of the first and second outer electrodes is defined by the conductive layer; and the formation mechanism is further configured to form the third portion of each of the first and second outer electrodes on each of the plurality of chips.

4. The manufacturing device according to claim 3, wherein the formation mechanism is configured to form the first portion of each of the first and second outer electrodes throughout an entire region in the width direction of the dielectric block, and to form the conductive layer in a stripe along the width direction of the dielectric block.

5. The manufacturing device according to claim 1, wherein the formation mechanism includes at least one of a screen printer, an ink-jet printer, a gravure printer, and a photolithography mechanism configured to form the conductive layer.

* * * * *